United States Patent
Scherer

(10) Patent No.: US 7,252,764 B2
(45) Date of Patent: Aug. 7, 2007

(54) METHOD FOR FABRICATION OF A MOLECULAR FILTER AND APPARATUS FORMED BY THE SAME

(75) Inventor: Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 1308 days.

(21) Appl. No.: 09/855,404

(22) Filed: May 15, 2001

(65) Prior Publication Data

US 2002/0173015 A1   Nov. 21, 2002

(51) Int. Cl.
   *B01D 29/46* (2006.01)
(52) U.S. Cl. .................. 210/321.6; 210/488; 210/489; 210/490; 210/492; 204/482; 156/77; 264/DIG. 48
(58) Field of Classification Search ............... 210/488, 210/489, 490, 321.6; 204/482; 156/77; 264/DIG. 48
   See application file for complete search history.

(56) References Cited

U.S. PATENT DOCUMENTS 2,028,168 A * 1/1936 Roberts
3,812,972 A * 5/1974 Rosenblum
4,721,567 A * 1/1988 Uram

* cited by examiner

*Primary Examiner*—Ana Fortuna
(74) *Attorney, Agent, or Firm*—Daniel L. Dawes; Myers Dawes Andras & Sherman LLP

(57) ABSTRACT

The invention is a method for fabricating molecular filters which can separate objects approximately 1-5 nm in range, where the filtration size is controlled by using thin films of materials and technologies to form a filtration channel or pore in a middle thin film layer in a multilayered structure. Lithography is used to define two offset arrays of blind holes into the opposing sides of a multi-layer membrane. The blind holes extend across a thin central filtration layer. A selective etch is used to attack the filtration layer to form a communicating channel between the two holes. The only connection between one side of the filter and the other is through the channel in the filter layer, whose thickness, d, determines the largest size object which can traverse the filter.

8 Claims, 2 Drawing Sheets

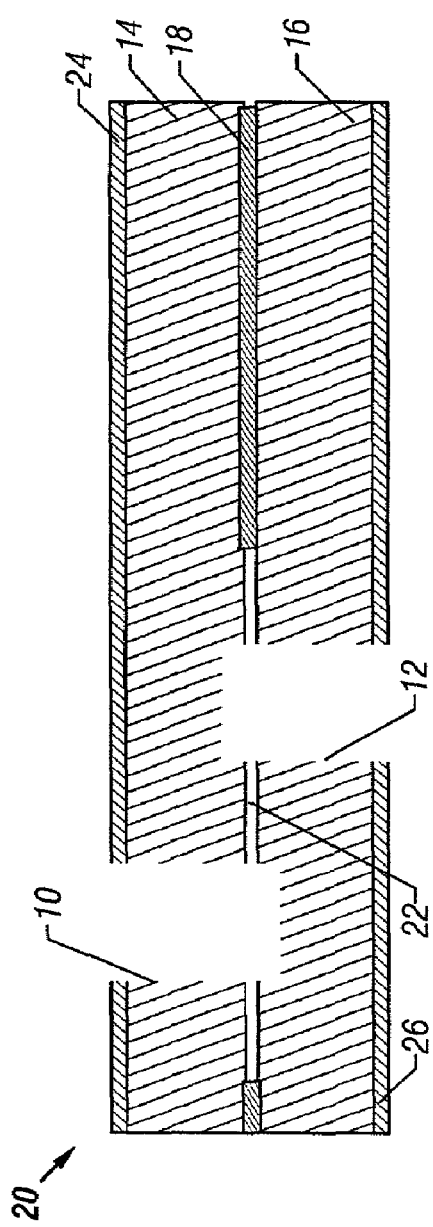
FIG. 3
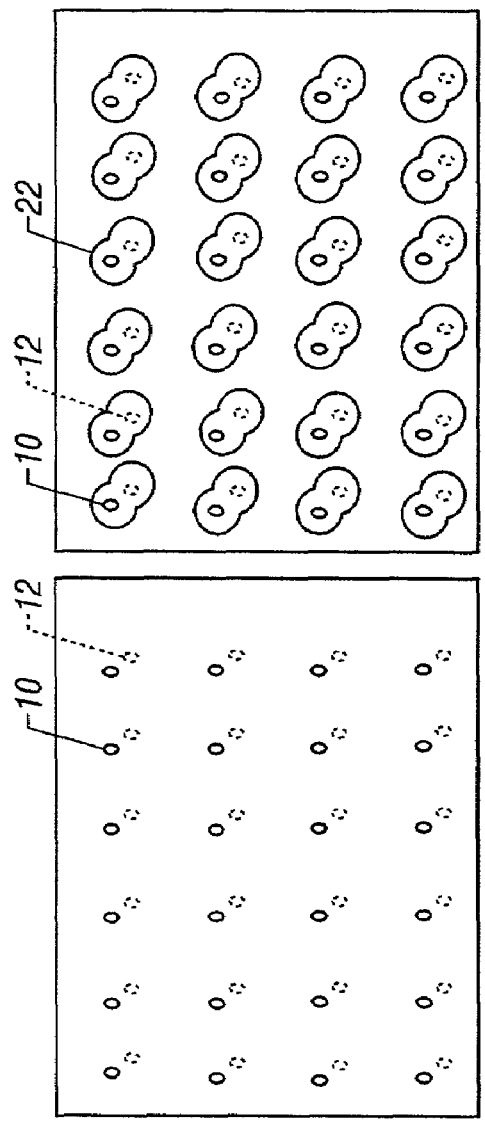
FIG. 4A
FIG. 4B

METHOD FOR FABRICATION OF A MOLECULAR FILTER AND APPARATUS FORMED BY THE SAME

BACKGROUND OF THE INVENTION

1. Field of the Invention

The invention relates the field of nano-scale technology and in particular to a method of making a molecular filter and the resulting filter so made.

2. Description of the Prior Art

The sorting and filtration of molecules is becoming an increasingly important technology. In the past, anodized aluminum filters have been fabricated for the filtration of bacterial and viruses from a solution. Such filters, with minimum hole sizes of about 10 nm, can also be defined lithographically by electron beam lithography and etching. However, it is much more challenging to filter structures with sizes even smaller than 10 nm, since the common self-assembly methods produce a large variations of hole sizes, and conventional lithographic methods are not capable of reaching resolutions of 1-5 nm.

What is needed is a method which will allow the fabrication of filters which can separate objects within this size range.

BRIEF SUMMARY OF THE INVENTION

The invention is a method for fabricating molecular filters which can separate objects approximately 1-5 nm in range, where the filtration size is controlled by using thin films of materials and technologies to form a filtration channel or pore in a middle thin film layer in a multilayered structure. Lithography is used to define two offset arrays of blind holes into the opposing sides of a multi-layer membrane. The blind holes extend across a thin central filtration layer. A selective etch is used to attack the filtration layer to form a communicating channel between the two holes. The only connection between one side of the filter and the other is through the channel in the filter layer, whose thickness, d, determines the largest size object which can traverse the filter.

More particularly the invention is defined as a method comprising the steps of forming a multilayered structure having at least a top layer, a middle layer and a bottom layer adjacent to each other. The middle layer has a thickness, d. At least a first hole is defined in the top layer and through the middle layer, and at least a second hole is defined in the bottom layer and through the middle layer. The first and second holes are offset from one another. A channel is defined between the first and second holes in the middle layer so that only objects having a size of d or smaller may traverse the multilayered structure through the first and second holes and the channel.

The step of forming a multilayered structure forms a top and bottom layer composed of material different from that composing the middle layer so that a selective etchant of the middle layer is used to define the channel. The step of forming a multilayered structure forms a middle layer with a thickness, d, in the range of 1-5 nm.

The step of defining at least a first hole in the top layer and defining at least a second hole in the bottom layer defines a plurality of offset holes in the top and bottom layer.

In a second embodiment the method further comprises the step of disposing a conductive layer on the top and bottom layers for the application of a radiofrequency signal to the conductive layer on the top and bottom layers to trap charged organic molecules traversing the structure. The method further comprises varying the radiofrequency signal to selectively match specific organic molecules traversing the structure. The step of defining at least the first and second hole simultaneously defines the first and second hole through the conductive layer on the top and bottom layers.

The step of defining at least the first and second hole comprises using electron beam lithography to delineate the first and second hole and further comprises imaging one of the top and bottom layers while lithographically delineating the other one of the top and bottom layers.

The invention is also characterized as an apparatus or filter devised by the foregoing steps and/or with the foregoing structure.

While the method has been described for the sake of grammatical fluidity as steps, it is to be expressly understood that the claims are not to be construed as limited in any way by the construction of "means" or "steps" limitations under 35 USC 112, but to be accorded the full scope of the meaning and equivalents of the definition provided by the claims. The invention can be better visualized by turning now to the following drawings wherein like elements are referenced by like numerals.

BRIEF DESCRIPTION OF THE DRAWINGS

FIG. 3 is a side cross-sectional view of a filter in which electrostatic gates are employed to control the filtration of charged organic molecules.

FIGS. 4a and 4b are plan views of the offset holes before and after isotropic etching of the sacrificial layer showing extent of removal in phantom outlines of the sacrificial layer.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
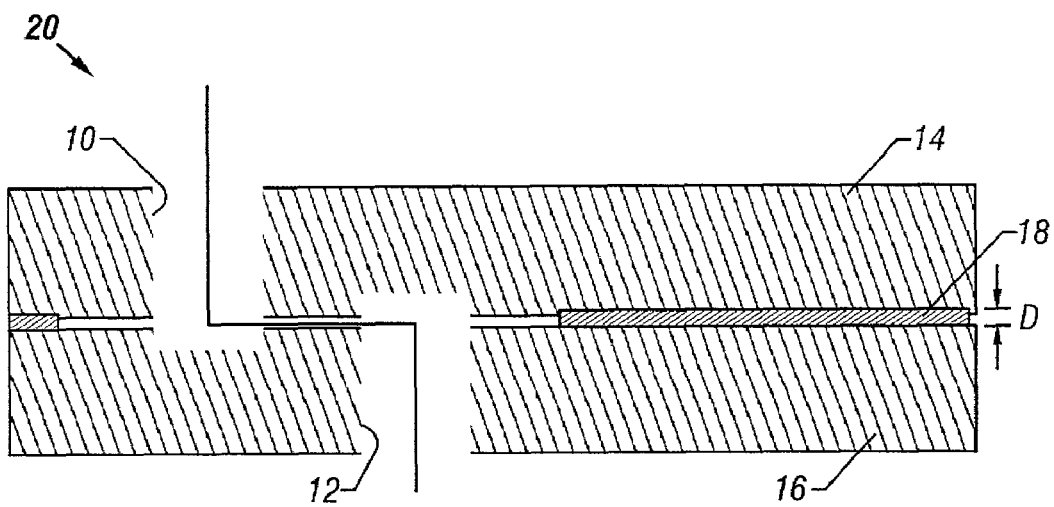
FIG. 1 is a side cross-sectional view of a filter in which a $SiO_2$ sacrificial layer provides lateral filtration of molecules passing through the membrane according to the invention.

The invention is a method which allows the fabrication of filters 20 which can separate objects approximately 1-5 nm in range, where the filtration size is controlled by using thin films of materials and technologies. In the illustrated method as shown in FIG. 1, lithography is used to define lithographic holes 10 and 12 with relatively large sizes onto both sides of a thin multi-layer membrane 14, 16. The lithographic patterns are transferred from both sides 14, 16 of the membrane across a thin central filtration layer 18, and then a selective etch is used to selectively attack the filtration layer 18. As long as the lithographic patterns are offset from each other, and the holes 10, 12 defined do not meet each other, the only connection region between one side of the resulting filter 14 and the other 16 is through the thin filter layer 18, whose thickness, d, determines the largest size object which can traverse the multilayer structure 14, 16, 18. The minimum thickness, d, of layer 18 which can be deposited depends on the roughness of the surfaces defining layer 18, as well as the crystallinity of the material of which it is composed. In the illustrated embodiment the use of silicon for the structural membrane layers 14, 16, and silicon dioxide (SiO$_2$) for the filtration layer 18. However we note that there are many choices of materials for such a filter 20, as long as a high chemical etch selectivity can be obtained for one of the materials over the other materials.

Figure 2A:
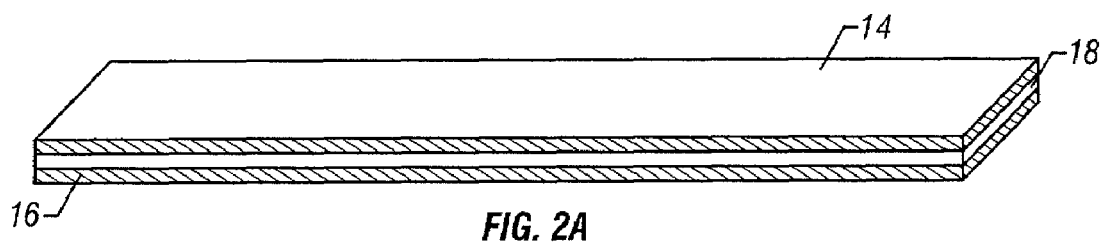
FIGS. 2a-2d are side cross-sectional views the fabrication steps for the filter of the illustrated embodiment in FIG. 1.
Figure 2B:
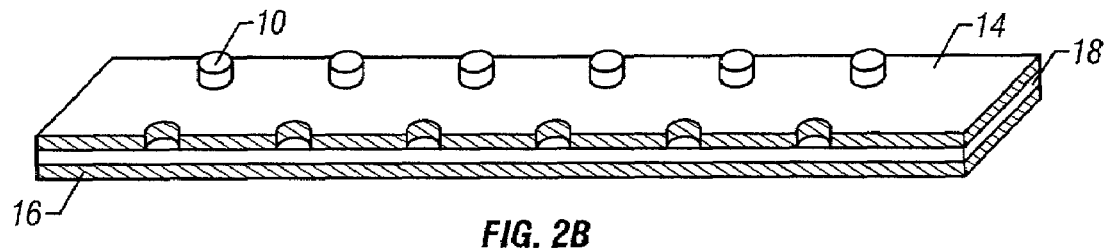
Figure 2C:
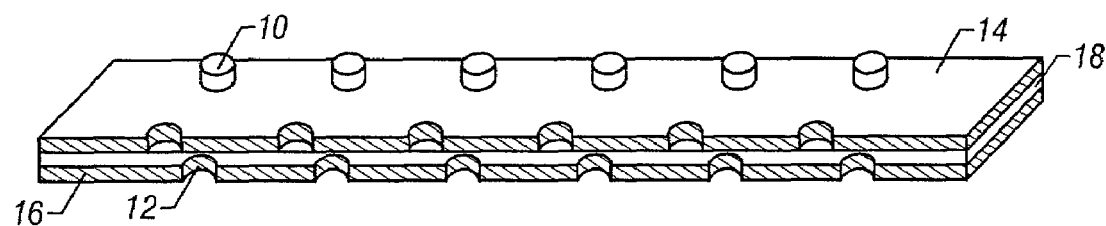
Figure 2D:
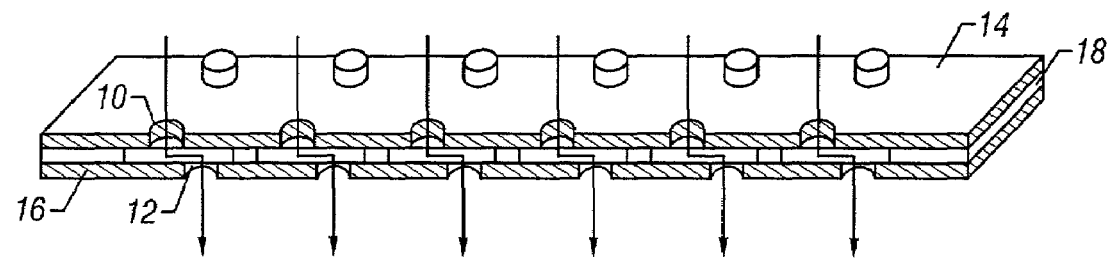

FIGS. 2a-2d depict the fabrication steps for the filter of the illustrated embodiment in FIG. 1. In FIG. 2a layers 14, 16 and 18 are formed by deposition to comprise the multilayer structure as a beginning step. Holes 10 are then etched through top layer 14 through middle layer 18 and slightly into bottom layer 16 as shown in FIG. 2b. Holes 12 are etched through bottom layer 16 through middle layer 18 and slightly into top layer 14 as shown in FIG. 2c. Holes 10 and 12 are offset from each other in the planar aspect of membrane 14, 16, 18 so that there is no direct communication between them. Middle layer 18 is then selectively etched as shown in FIG. 2d to open a communicating channel 22 from hole 10 through layer 18 to hole 12. There is no or little etching of the material of layers 14 and 16 by this last selective etch.

If insulating membrane materials are selected, it is also possible to add electrostatic gates which allow us to take advantage of the attraction of some organic molecules which have a slight electrostatic charge. Such molecules can be attracted into holes 10 and 12, and can be trapped by the application of an alternating field with an appropriately configured radiofrequency field, if top layer 14 and bottom layer 16 of the membrane are metalized with layers 24 and 26 as shown in FIG. 3. The top and bottom conductive layers 24 and 26 respectively of the multilayer thin film stack are contacts which are etched during the definition of the holes 10 and 12. The radiofrequency signal is applied to the contacts by a variable RF generator 28. Molecules which can diffuse through the filter 20 within a period of the a-c field applied to the metal contacts will be able to pass through this filter, whereas slower molecules will be trapped within the filter structure. As the frequency of the applied field is changed, the length of the molecules which can be filtered can also be controlled.

In addition, a DC voltage can be applied across conductive layers 24 and 26 causing the upper and lower walls of channel 22 to be squeezed together and hence the channel width narrowed. The degree of filtration provided by channel 22 can thus be electronically modulated, tuned or set according to the magnitude of the DC voltage applied across conductive layers 24 and 26. Thus, various particle sizes or macromolecules can be selectively passed or filtered out by use of the invention by control over the width of channel 22. In the extreme, channel 22 can be squeezed shut and act as an electrically actuatable valve.

An important consideration for the fabrication of this kind of filter 20 is in fabricating relatively small holes 10 and 12 which are offset from each other, and etching only partly through the multilayer stack 14, 16, 18. This can be accomplished by a combination of electron beam lithography and reactive ion etching. For the silicon materials system, it is very easy to image features on the bottom layer 16, 26 of the multilayer stack 14, 16, 18 while performing lithography on top layer 14, 24 so long as the total multilayer thickness is less than 0.5 microns thick (i.e., is somewhat electron transparent). Thus, if a thin enough layer is chosen, alignment can be performed by electron imaging the opposite side of the multilayer filter 20.

FIGS. 4a and 4b depict two steps in the fabrication of filter 20 of FIG. 3. In the top plan view of FIG. 4a, holes 10 and 12 are formed through both top and bottom layers 14, 24 and 16, 26 respectively using electron beam lithography and reactive ion etching. The top plan view of FIG. 4b illustrates the formation of channel 22 between holes 10 and 12 using selective etching.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. An apparatus comprising:
   a multilayered structure having at least a top layer, a middle layer and a bottom layer adjacent to each other, where the middle layer has a thickness, d;
   at least a first hole in the top layer and through the middle layer;
   at least a second hole in the bottom layer and through the middle layer, the first and second holes being offset from one another;

a channel having a height of d or smaller, the channel being defined in the middle layer and communicating with the first and second holes so that only objects having a size of d or smaller may traverse the multilayered structure through the first and second holes and the channel; and a conductive layer on said top and bottom layers for the application of a signal to said conductive layer on said top and bottom layers to trap charged organic molecules traversing said structure, to vary filtration realized through said channel by means of channel restriction, or to provide valving through said channel.

2. The apparatus of claim 1 further comprising a source of a variable radiofrequency signal to selectively match specific organic molecules traversing said structure.

3. The apparatus of claim 1 further comprising a source of a variable DC signal to vary filtration realized through said channel by means of channel restriction, or to provide valving through said channel.

4. The apparatus of claim 1 where said first and second hole are simultaneously defined through said conductive layer on said top and bottom layers.

5. The apparatus of claim 4 where said first and second hole are delineated using electron beam lithography and wherein one of said top and bottom layers can be imaged while said other one of said top and bottom layers is lithographically delineated.

6. The apparatus of claim 1 wherein said top and bottom layer are composed of a material different from that composing said middle layer so that a selective etchant of said middle layer is used to define said channel.

7. The apparatus of claim 1 where said multilayered structure forms a middle layer with a thickness, d, in the range of 1-5 nm.

8. The apparatus of claim 1 further comprising a plurality of offset holes in said top and bottom layer.

* * * * *